United States Patent
Johar

(10) Patent No.: US 10,084,478 B2
(45) Date of Patent: Sep. 25, 2018

(54) APPARATUS AND METHOD FOR GENERATING AN ERROR CODE FOR A BLOCK COMPRISING A PLURALITY OF DATA BITS AND A PLURALITY OF ADDRESS BITS

(71) Applicant: ARM Limited, Cambridge (GB)

(72) Inventor: Kauser Yakub Johar, Cambridge (GB)

(73) Assignee: ARM Limited, Cambridge (GB)

( * ) Notice: Subject to any disclaimer, the term of this patent is extended or adjusted under 35 U.S.C. 154(b) by 0 days.

(21) Appl. No.: 15/587,429

(22) Filed: May 5, 2017

(65) Prior Publication Data
US 2017/0346504 A1    Nov. 30, 2017

(30) Foreign Application Priority Data
May 31, 2016 (GB) .................................. 1609538.2

(51) Int. Cl.
*H03M 13/00* (2006.01)
*H03M 13/05* (2006.01)
*G06F 11/10* (2006.01)

(52) U.S. Cl.
CPC ......... *H03M 13/05* (2013.01); *G06F 11/1016* (2013.01); *H03M 13/616* (2013.01)

(58) Field of Classification Search
None
See application file for complete search history.

(56) References Cited

U.S. PATENT DOCUMENTS 6,757,862 B1 * 6/2004 Marianetti, II ....... H03M 13/05
                                                                714/759
6,879,504 B1 * 4/2005 Lien .................... G11C 11/4125
                                                                365/189.07

(Continued)

FOREIGN PATENT DOCUMENTS

WO    WO 2013/006222    1/2013

OTHER PUBLICATIONS

Seong et al., "SAFER: Stuck-At-Fault Error Recovery for Memories", $43^{rd}$ Annual IEEE/ACM International Symposium on Microarchitecture, IEEE, Dec. 4, 2010, pp. 115-124.

Primary Examiner — Mujtaba M Chaudry
(74) Attorney, Agent, or Firm — Nixon & Vanderhye P.C.

(57) ABSTRACT

An apparatus and method are provided for generating an error code for a block comprising a plurality of data bits and a plurality of address bits. The apparatus has block generation circuitry to generate a block comprising a plurality of data bits and a plurality of address bits, and error code generation circuitry for receiving that block and a mask array comprising a plurality of mask rows, and for then applying an error code generation algorithm to generate an error code for the block. The error code comprises a plurality of check bits, where each check bit is determined using the block and a corresponding mask row of the mask array. Each mask row comprises a plurality of mask bits, each mask bit being associated with a corresponding bit of the block. At least one mask row has its mask bit values constrained so as to ensure that when all of the data bits of the block have the same value, the error code generated by the error code generation circuitry has at least one check bit having a different value to the value of the data bits irrespective of the value of the address bits. In addition to supporting detection and/or correction of errors in the data bits, such an approach also allows memory address decode errors to be detected (Continued)

while in addition allowing detection of stuck at zero or stuck at one errors in a memory's output.

22 Claims, 9 Drawing Sheets

(56) References Cited

U.S. PATENT DOCUMENTS

| | | | | |
|---|---|---|---|---|
| 6,978,343 B1* | 12/2005 | Ichiriu | ............ | G11C 15/00 |
| | | | | 365/49.1 |
| 2005/0172065 A1* | 8/2005 | Keays | ............ | G06F 11/1068 |
| | | | | 711/103 |
| 2006/0010346 A1* | 1/2006 | Minemier | ............ | G01T 3/08 |
| | | | | 714/30 |
| 2007/0283193 A1* | 12/2007 | Lewis | ............ | G06F 11/1064 |
| | | | | 714/48 |

\* cited by examiner

ECC Mask for DED scheme (but not conforming to
the techniques of the described embodiments)

| -  | D7 | D6 | D5 | D4 | D3 | D2 | D1 | D0 | A3 | A2 | A1 | A0 |
|----|----|----|----|----|----|----|----|----|----|----|----|----|
| C0 | 0  | 1  | 1  | 1  | 1  | 0  | 1  | 0  | 1  | 0  | 1  | 0  |
| C1 | 1  | 0  | 0  | 0  | 0  | 1  | 1  | 1  | 0  | 1  | 0  | 1  |
| C2 | 0  | 0  | 1  | 0  | 0  | 1  | 1  | 0  | 1  | 1  | 1  | 1  |
| C3 | 1  | 1  | 1  | 0  | 1  | 0  | 0  | 1  | 0  | 1  | 0  | 1  |
| C4 | 0  | 1  | 0  | 1  | 0  | 1  | 1  | 1  | 1  | 1  | 0  | 0  |

FIG. 1

ECC Mask for DED scheme according to one embodiment

| - | D7 | D6 | D5 | D4 | D3 | D2 | D1 | D0 | A3 | A2 | A1 | A0 | EFFECTIVE EXTRA COLUMN RESULTING FROM ECC COMPUTATION ALGORITHM |
|---|----|----|----|----|----|----|----|----|----|----|----|----|---|
| C0 | 1 | 1 | 0 | 1 | 1 | 1 | 1 | 1 | 0 | 0 | 0 | 0 | 1 |
| C1 | 0 | 0 | 1 | 0 | 1 | 0 | 1 | 0 | 0 | 0 | 1 | 1 | 0 |
| C2 | 1 | 0 | 0 | 1 | 0 | 0 | 1 | 1 | 1 | 0 | 1 | 1 | 0 |
| C3 | 1 | 0 | 1 | 0 | 0 | 1 | 0 | 0 | 1 | 0 | 0 | 0 | 0 |
| C4 | 0 | 1 | 0 | 0 | 0 | 0 | 1 | 1 | 1 | 1 | 0 | 1 | 0 |

FIG. 3

Mask for SECDED scheme according to one embodiment

EFFECTIVE EXTRA
COLUMN RESULTING
FROM ECC
COMPUTATION
ALGORITHM

| - | D7 | D6 | D5 | D4 | D3 | D2 | D1 | D0 | A3 | A2 | A1 | A0 |   |
|---|----|----|----|----|----|----|----|----|----|----|----|----|---|
| C0 | 0 | 0 | 1 | 1 | 1 | 1 | 0 | 1 | 0 | 0 | 0 | 0 | 1 |
| C1 | 1 | 1 | 0 | 0 | 0 | 0 | 1 | 0 | 0 | 0 | 0 | 0 | 1 |
| C2 | 1 | 1 | 0 | 0 | 1 | 1 | 0 | 1 | 0 | 1 | 1 | 1 | 0 |
| C3 | 1 | 0 | 1 | 0 | 1 | 1 | 1 | 0 | 1 | 1 | 0 | 1 | 0 |
| C4 | 0 | 0 | 1 | 1 | 1 | 0 | 1 | 1 | 1 | 1 | 1 | 0 | 0 |
| C5 | 0 | 1 | 0 | 1 | 1 | 0 | 0 | 0 | 0 | 1 | 1 | 1 | 0 |

205 → C0
210 → C1
200 (mask)
215 (effective extra column)

FIG. 5A

Mask for DECTED scheme according to one embodiment

EFFECTIVE EXTRA
COLUMN RESULTING
FROM ECC
COMPUTATION
ALGORITHM

| - | D8 | D7 | D6 | D5 | D4 | D3 | D2 | D1 | D0 | A3 | A2 | A1 | A0 |   |
|---|----|----|----|----|----|----|----|----|----|----|----|----|----|---|
| C0 | 0 | 0 | 1 | 0 | 0 | 0 | 1 | 0 | 1 | 0 | 0 | 0 | 0 | 1 |
| C1 | 1 | 1 | 0 | 0 | 1 | 0 | 0 | 0 | 0 | 0 | 0 | 0 | 0 | 1 |
| C2 | 0 | 0 | 0 | 1 | 0 | 1 | 0 | 1 | 0 | 0 | 0 | 0 | 0 | 1 |
| C3 | 0 | 0 | 1 | 0 | 1 | 1 | 1 | 0 | 1 | 1 | 0 | 1 | 1 | 0 |
| C4 | 0 | 1 | 1 | 1 | 1 | 0 | 0 | 1 | 1 | 1 | 1 | 0 | 1 | 0 |
| C5 | 1 | 1 | 1 | 1 | 0 | 0 | 1 | 1 | 1 | 1 | 1 | 1 | 0 | 0 |
| C6 | 1 | 1 | 1 | 1 | 0 | 1 | 1 | 1 | 0 | 1 | 1 | 1 | 1 | 0 |
| C7 | 1 | 1 | 0 | 1 | 1 | 1 | 1 | 0 | 1 | 1 | 1 | 1 | 1 | 0 |
| C8 | 1 | 1 | 0 | 1 | 1 | 1 | 0 | 1 | 0 | 0 | 1 | 1 | 1 | 0 |

255 → C0
260 → C1
265 → C2
250 (mask)
270 (effective extra column)

FIG. 5B

Table showing hamming distances and minimum number of rows that are needed with 0s in the address position:-

| Scheme | Hamming D | minimum no of Rows | Comment |
| --- | --- | --- | --- |
| DED | 3 | 1 | Double error detection |
| SECDED | 4 | 2 | Single error correction and double error detection |
| SECTED | 5 | 2 | Single error correction and triple error detection |
| DECTED | 6 | 3 | Double error correction and triple error detection |

FIG. 6

APPARATUS AND METHOD FOR GENERATING AN ERROR CODE FOR A BLOCK COMPRISING A PLURALITY OF DATA BITS AND A PLURALITY OF ADDRESS BITS

This application claims priority to GB Patent Application No. 1609538.2 filed May 31, 2016, the entire contents of which are hereby incorporated by reference.

BACKGROUND

The present technique relates to mechanisms for generating an error code that can be stored with associated data in memory to enable later detection and/or correction of errors. For example, such an error code can be used to detect situations where the associated data has been corrupted, due for example to a soft or a hard error.

Dependent on the error code scheme employed, such error codes may only allow errors in a certain number of bits to be detected, but not corrected, or alternatively may allow errors in a certain number of bits to be detected, but also enable errors in a reduced number of bits to be corrected. Generally, whether the error codes solely provide for detection of errors, or also provide for correction of errors, those error codes are referred to as error correction codes (ECCs).

In modern data processing systems there may be a number of requirements for the types of errors that need to be detected and/or corrected. For instance, considering a data value to be stored within memory (herein such a data value also being referred to as a datum), the error code generated for storing in association with that datum may not only be required to enable errors in the datum to be detected and/or corrected. For example, it may also be desired to use the error code to detect situations where the memory output obtained during a read operation is stuck at all zeros or stuck at all ones.

However, in addition, it may be desirable to use the error code to seek to detect faults in the memory address decoding operation, which may result in the contents returned from the memory having the correct integrity, but the wrong address having been accessed. To achieve such memory address decoding protection, it is possible to use both the datum and the address when generating the error code stored in memory. Then, when the datum is read from memory, the read address and datum are used to generate another error code that can be checked against the error code read from memory in association with the datum.

Whilst such an approach can provide an effective mechanism for detecting faults in the memory address decoding, it compromises the ability to detect situations where the memory output is stuck at all zeros or stuck at all ones, due to the fact that the address is used in combination with the datum when generating the code, and the address can have any arbitrary value relative to the datum.

Accordingly, it would be desirable to provide an improved mechanism for generating an error code for a block (also referred to herein as a chunk) comprising a plurality of data bits and a plurality of address bits, that allows memory address decode faults to be detected whilst also allowing detection of stuck at zero or stuck at one faults in a memory's output.

SUMMARY

In a first example configuration, there is provided an apparatus, comprising: block generation circuitry to generate a block comprising a plurality of data bits and a plurality of address bits; and error code generation circuitry to receive said block and a mask array comprising a plurality of mask rows, and to apply an error code generation algorithm to generate an error code for said block, said error code comprising a plurality of check bits where each check bit is determined using said block and a corresponding mask row of said mask array; wherein each mask row comprises a plurality of mask bits, each mask bit being associated with a corresponding bit of said block, and at least one mask row has its mask bit values constrained so as to ensure that when all of the data bits of the block have the same value, the error code generated by the error code generation circuitry has at least one check bit having a different value to the value of the data bits irrespective of the value of the address bits.

In another example configuration, there is provided write protection circuitry to generate an error code to be stored in association with write data at a specified memory address of a storage device, comprising an apparatus as per the first example configuration to generate the error code from the write data and the specified memory address, wherein the plurality of data bits of the block are formed from the write data and the plurality of address bits of the block are formed from the specified memory address.

In a further example configuration, there is provided read protection circuitry to perform an error check process on read data obtained from a specified memory address in a storage device, comprising: an apparatus as per the first example configuration to generate an error code from the read data and the specified memory address, wherein the plurality of data bits of the block are formed from the read data and the plurality of address bits of the block are formed from the specified memory address; and check circuitry to compare the generated error code with an error code stored in the storage device in association with the read data in order to detect an error condition when the generated error code differs from the stored error code.

In a still further example configuration, there is provided a computer-implemented method of generating a mask array comprising: determining a number of mask rows of the mask array so that one mask row is provided for each check bit of an error code to be generated using said mask array; determining a number of mask bits in each mask row dependent on a number of bits in a block for which the error code is to be generated, the block comprising a plurality of data bits and a plurality of address bits; and for at least one of the mask rows, executing on processing circuitry a mask bit generating process to constrain the mask bit values of that mask row so as to ensure that when all of the data bits of the block have the same value, the error code generated for that block using the mask array has at least one check bit having a different value to the value of the data bits irrespective of the value of the address bits.

In an additional example configuration, there is provided a storage medium containing a mask array generated in accordance with the computer-implemented method of the above example configuration.

BRIEF DESCRIPTION OF THE DRAWINGS

The present technique will be described further, by way of example only, with reference to embodiments thereof as illustrated in the accompanying drawings, in which:

FIG. 1 illustrates an ECC mask array generated in accordance with a known scheme;

FIG. 3 illustrates an ECC mask array generated in accordance with the technique of one embodiment;

FIGS. 5A and 5B illustrate further examples of mask arrays that may be generated using the technique of the described embodiments;

FIG. 6 is a table illustrating the minimum number of rows within the mask array that need to be subjected to the specific row generation rules of the described embodiments, for a number of different types of error code scheme that may be employed;

DESCRIPTION OF EMBODIMENTS

Figure 2:
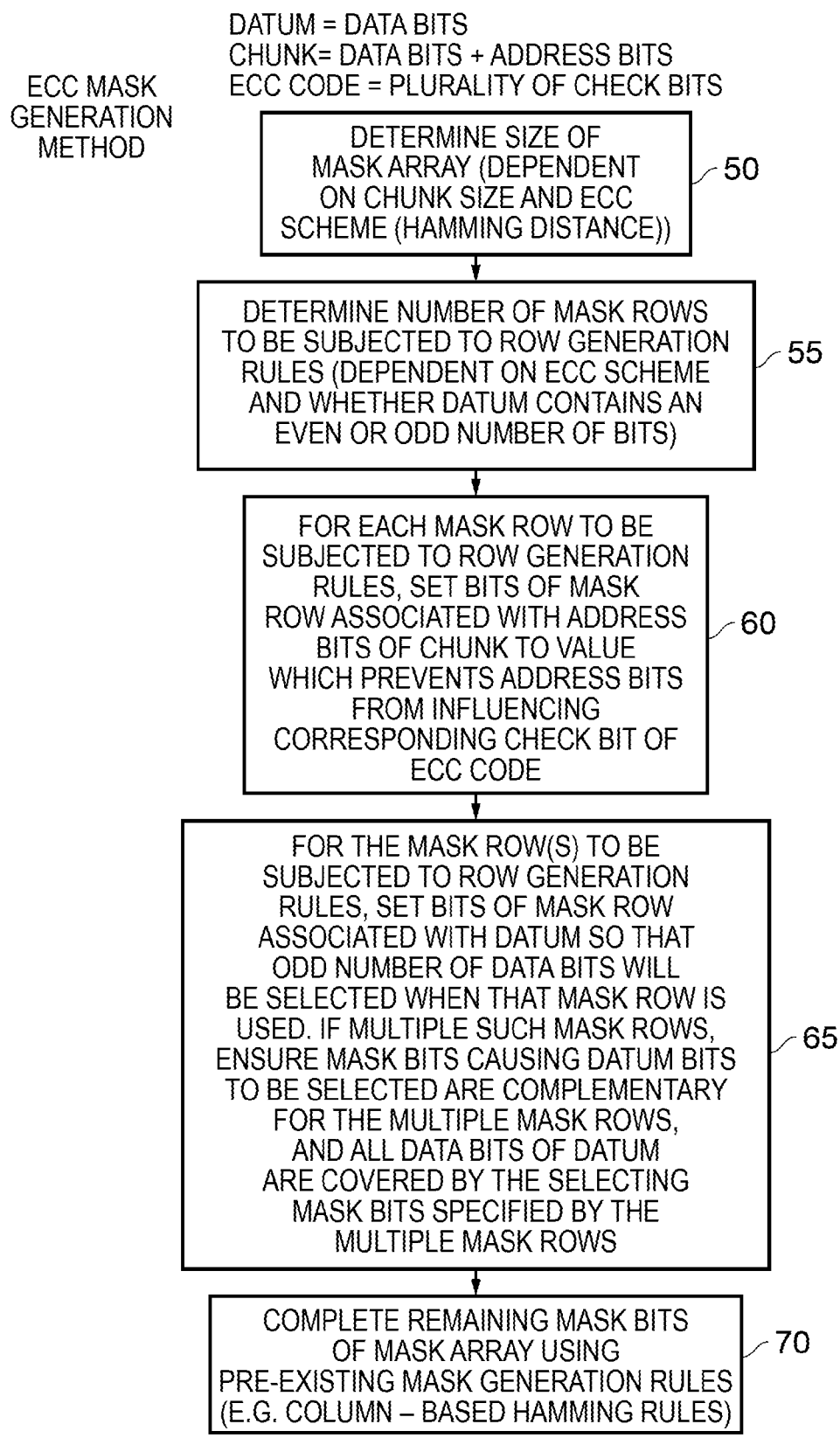
FIG. 2 is a flow diagram illustrating a method of generating an ECC mask array in accordance with one embodiment.

Before discussing the embodiments with reference to the accompanying figures, the following description of embodiments is provided.

In one embodiment, an apparatus is provided that has block generation circuitry to generate a block comprising a plurality of data bits and a plurality of address bits, and error code generation circuitry to generate an error code for that block. In particular, the error code generation circuitry has access to a mask array comprising a plurality of mask rows and, using both the mask array and the block, then applies an error code generation algorithm to generate an error code for the block. The error code comprises a plurality of check bits where each check bit is determined using the block and a corresponding mask row of the mask array.

Each mask row comprises a plurality of mask bits, where each mask bit is associated with a corresponding bit of the block. At least one mask row has its mask bit values constrained so as to ensure that when all of the data bits of the block have the same value, the error code generated by the error code generation circuitry has at least one check bit having a different value to the value of the data bits irrespective of the value of the address bits.

In accordance with the described technique, the error code is generated for a block that comprises both data bits and address bits, and as a result the error code can be used to allow memory address decode faults to be detected. However, in addition, by constraining the mask bit values in at least one of the mask rows in the manner set out above, it is possible to ensure that the data bits and the check bits of the associated error code will not all have the same value, hence ensuring that stuck at zero and stuck at one faults can be reliably detected. In particular, by the above mechanism, an error code of all zeros will not be generated when the data bits are all zeros, irrespective of the values of the address bits used when generating the error code. Similarly, an error code of all ones will not be generated when the data bits are all ones. As a result, if when performing a read operation from memory, the read data bits and associated error code check bits are either all ones or all zeros, this will indicate a stuck at one or stuck at zero error.

There are a number of ways in which the mask bit values in at least one of the mask rows can be constrained so as to ensure that the generated error code has at least one check bit with a different value to the value of the data bits irrespective of the address bits, when all of the data bits have the same value. In one embodiment, this is achieved by each mask row in said at least one mask row having its mask bit values arranged so as to cause none of the address bits of the block to be selected for use in generating the corresponding check bit. Hence, in such mask rows the address bit values are masked out so that they are not used when generating the corresponding check bit. Conversely, at least some of the address bits may be used in the other mask rows that are not subjected to the above mentioned constraints.

In one embodiment, the number of mask rows forming said at least one mask row is dependent on an error code scheme employed by the apparatus, and whether the plurality of data bits in said block is even or odd. Generally, the larger the number of data bits that are to be correctable by the error code scheme, the larger the number of mask rows that will need to be subjected to the above mentioned constraints. Further, in the described embodiments, for any particular error code scheme, one additional mask row may need to be included within the set of mask rows subjected to the above mentioned constraints, dependent on whether there are an even number or an odd number of data bits in the block.

The above described techniques can be applied to a variety of different error code schemes. However, in one embodiment the error code schemes employed are based on Hamming codes. When employing such Hamming codes, the number of mask rows forming said at least one mask row is dependent on the Hamming distance of the particular Hamming code, as well as being dependent on whether the plurality of data bits in the block is even or odd. As will be understood by those skilled in the art, the Hamming distance represents the minimal number of bit changes needed to go from any one valid code word to any other valid code word. The Hamming distance increases when increasing the number of bits to be correctable by the error code scheme.

In one embodiment, the number of mask rows N0 forming said at least one mask row is given by the equation:

$$N0 = 1 + C + [[((1+C)\%2)! = (Dt\ \%2)]\&(C! = 0)]$$

where C is the number of bits correctable by the error code scheme, Dt is the number of data bits in said plurality of data bits, and % denotes a modulo operator.

In one embodiment, each mask row in said at least one mask row has its mask bit values arranged so as to cause an odd number of data bits within the block to be selected for use in generating the corresponding check bit. This requirement may be used in combination with the error code generation algorithm to ensure that when the data bits are all the same, the check bit produced has a value different to those data bits.

Further, in one embodiment, when said at least one mask row comprises multiple mask rows, the mask bit values in said multiple mask rows are arranged to ensure that different data bits within the block are selected by each of those multiple mask rows for use in generating the corresponding check bit.

Furthermore, in one embodiment, when said at least one mask row comprises multiple mask rows, the mask bit values in said multiple mask rows are arranged to further ensure that each data bit within said block is selected by one of the multiple mask rows for use in generating the corresponding check bit.

In one embodiment, there will be multiple mask rows whenever the error code scheme allows not only for detection of errors, but also correction of at least one error. As will be discussed in more detail later with reference to FIG. 2, the above constraints on the multiple mask rows ensure that a stuck at zero or stuck at one error is not incorrectly interpreted as a single bit correctable error.

In one embodiment, the error code generation algorithm used by the error code generation circuitry is adapted to take into account the form of the mask array as discussed above. In particular, in one embodiment the error code generation algorithm comprises a main process to generate a first check bit from the block and a corresponding mask row, and an additional process selectively applied to invert the first check bit to produce a second check bit. The error code generated by the error code generation circuitry then comprises the second check bit generated using any mask rows forming said at least one mask row, and the first check bit generated using each of the remaining mask rows. Hence, by such an approach, when generating the check bit associated with any of the mask rows that have been subjected to the above-mentioned mask bit value constraints, a final flipping of the value of the check bit is performed prior to it being used within the error code.

In particular, as mentioned earlier, each mask row in said at least one mask row has its mask bit values arranged so as to cause an odd number of the data bits within the block to be selected for use in generating the corresponding check bit. By ensuring that an odd number of the data bits are used, and given that the address bits are not used when generating the check bit for any such mask row, this can be used to ensure in one embodiment that when all of those data bits have the same value, the initial check bit produced by the main process will also be of the same value as those data bits, and then the additional process will invert that check bit prior to it being used in the error code. This ensure that at least that finally produced check bit for the error code will have a different value to the data bits. Hence, this ensures that when the data is all zeros, at least one check bit will be non-zero, and similarly if the data is all ones at least one check bit will be zero.

The main process can take a variety of forms, but in one embodiment comprises using a mask row to select a subset of the bits forming the block, and then performing an XOR reduce operation on the selected subset of the bits to produce an associated first check bit. Furthermore, in one embodiment the additional process comprises an XOR operation to invert the value of the first check bit.

The above described apparatus can be used in a variety of situations. For example, in one embodiment write protection circuitry is provided to generate an error code to be stored in association with write data at a specified memory address of a storage device. That write protection circuitry may be arranged to include the above described apparatus in order to generate the error code from the write data and the specified memory address. In such an embodiment, the plurality of data bits of the block are formed from the write data and the plurality of address bits of the block are formed from the specified memory address. In one embodiment, all bits of the write data and all bits of the memory address are used when constructing the block.

In another example, the above described apparatus can be used in read protection circuitry that is employed to perform an error check process on read data obtained from a specified memory address in a storage device. The read protection circuitry will include the above-mentioned apparatus in order to generate an error code from the read data and the specified memory address. The plurality of data bits of the block are formed from the read data and the plurality of address bits of the block are formed from the specified memory address. Further, the read protection circuitry has check circuitry to compare the generated error code with an error code stored in the storage device in association with the read data, in order to detect an error condition when the generated error code differs from the stored error code.

In another example embodiment, a computer-implemented method of generating a mask array is provided, that comprises determining a number of mask rows of the mask array so that one mask row is provided for each check bit of an error code to be generated using said mask array, and determining a number of mask bits in each mask row dependent on a number of bits in a block for which the error code is to be generated. The block comprises a plurality of data bits and a plurality of address bits. For at least one of the mask rows, the method comprises executing on processing circuitry a mask bit generating process to constrain the mask bit values of that mask row so as to ensure that when all of the data bits of the block have the same value, the error code generated for that block using the mask array has at least one check bit having a different value to the value of the data bits irrespective of the value of the address bits.

In one embodiment, for all remaining mask rows other than said at least one mask row, the mask bit generating process employs default mask generation rules to determine the mask bits values. Hence, whilst the earlier-mentioned constraints are used when determining the mask bit values for a certain number of the mask rows of the mask array, the mask bit values for all of the remaining parts of the mask array are completed using default rules. There are a number of known techniques for calculating mask bit values for a mask array that can be used as the default mask generation rules for populating the remaining portions of the mask array that are not subjected to the specific constraints mentioned earlier. In one example, the default mask generation rules comprise column-based Hamming rules.

Particular embodiments will now be described with reference to the Figures.

FIG. 1 is a table showing an ECC mask array 10 that may be produced in accordance with a known technique for a double error detection (DED) error code scheme, for which the Hamming distance is three. In this example, it is assumed that the address consists of four bits and the data consists of eight bits, and that the data and address bits are concatenated in order to form a block (also referred to herein as a chunk) which is then used as an input to an error code generation algorithm. Given the fact that there are hence 12 bits within the chunk to be protected, and given the use of the DED scheme with a Hamming distance of three, this requires five check bits C0 to C4 to form the error code. As shown in FIG. 1, each mask row within the mask array is associated with one of those check bits.

In accordance with one error code generation technique, for each check bit to be generated, the associated mask row is used as a mask so as to select the data and address bits associated with a logic one value in the mask, and to discard the data and address bits associated with a logic zero value in the mask (it will be appreciated that in an alternative embodiment the meaning of the logic one and logic zero values in the mask could be reversed). The data and address bits that are selected based on the mask row values are then subjected to an XOR reduce operation in order to produce the check bit value.

Once the check code has been generated using the above approach, then that check code may be stored in memory in association with the data bits (the data bits also being referred to herein as the datum). When data is later read from the memory, a check is performed by first re-generating a check code from the read datum and the address presented to the memory, using the same mask array as was used to generate the original check code. The generated check code is then compared with the original check code as read from memory, for example by performing an XOR operation. If the two check codes differ, then this provide an indication of an error.

As mentioned earlier, such error codes can be used not only to detect and/or correct errors in the datum when the datum is read from memory, but also to detect address decode faults where the contents returned from memory have the correct integrity but the wrong address has been accessed. This is possible due to the factoring of the address bits into the error code generation mechanism. It is also desirable to be able to detect situations where the complete memory output is stuck at zero or stuck at one, and this can be problematic when using the ECC scheme to also detect address decode errors, as will be illustrated by way of example below. In particular, it is possible for an all zeros check code to be legitimately generated using the mask array of FIG. 1 when the datum bits are all zero, dependent on the address bits. Similarly, an all ones check code may be generated when the datum bits are all ones. In that scenario, it is not possible to detect a stuck at zeros or stuck at ones fault, since it could legitimately be expected that the contents read from memory would be all zeros or all ones. Consider for example a situation where the address is 4'b1111 (i.e. all ones) and the data is 8'b0000_0000 (i.e. all zeros). When using the mask array of FIG. 1, the check code generated for the above combination of address and data is 5'b00000 (even though the data is all zeros). Hence, when using the mask array of FIG. 1, it is not possible to detect a stuck at zeros fault when reading the datum and check code back from memory.

It might be considered that one way to address this problem would be to selectively include XNOR functions on some of the rows of the mask array, which could be used to basically flip a zero to a one. However, when supporting address decoder protection by using the address bits, the address can take any value (with any possible value of data) and it has been found that some combinations of address and data can cancel out the XNOR functionality (or XOR in some rows), again resulting in an all zeros check code.

The embodiments described with reference to the remaining figures aim to alleviate this problem so that an ECC scheme can be used to simultaneously support both address decode fault detection and stuck at zeros or stuck at ones detection.

FIG. 2 is a flow diagram illustrating an ECC mask generation method that may be performed in accordance with one embodiment in order to generate a mask array.

At step 50, the required size of the mask array is determined. From the earlier discussion of FIG. 1, it will be appreciated that the size of the mask array is dependent on the chunk size (consisting of the data bits and the address bits) and the ECC scheme employed, and hence the applicable Hamming distance. In particular, the chunk size will affect the number of columns in the mask array, and the chunk size in combination with the Hamming distance will determine the number of check bits required in the ECC code, and hence the number of mask rows required within the mask array.

Following step 50, then at step 55 the number of mask rows that are to be subjected to special row generation rules (to be described in more detail below) are determined. The number of mask rows required to be subjected to the special row generation rules will be dependent on the ECC scheme with which the mask array is to be used, and whether the datum has an even number or an odd number of bits. In particular, in one embodiment the number of mask rows can be determined by the equation:

$$N0=1+C+[[((1+C)\%2)!=(Dt\ \%2)]\&(C!=0)]$$

where C is the number of bits correctable by the error code scheme, Dt is the number of data bits in said plurality of data bits, and % denotes a modulo operator.

As will be apparent from the above equation, if the error code scheme only supports detection of errors in a number of bits, but does not support any form of correction of those errors, then the variable "C" will be equal to zero. As a result, the above equation indicates that the number of mask rows to be subjected to the special row generation rules will be one in instances where only error detection is supported. However, if error correction is supported, then at least two mask rows will need to be subjected to the special row generation rules. Furthermore, an additional row may be required dependent on whether the number of bits in the datum is even or odd. For example, if one bit is correctable by the error code scheme, the above equation indicates that the number of mask rows that need to be subjected to the special row generation rules is two provided that the number of datum bits is even, or is three if the number of datum bits is odd.

Further, the same equation indicates that when the number of bits that are correctable is two, then three mask rows will need to be subjected to the special row generation rules if the number of datum bits is odd, but otherwise four mask rows will need to be subjected to those rules.

Following the determination performed at step 55, then for each of those mask rows that are to be subjected to the special row generation rules, at step 60 the bits of each such mask row associated with the address bits of the chunk are set to a value which prevents those address bits from influencing the corresponding check bit of the ECC code. Using the earlier discussed example where a logic one value in a mask row causes the corresponding data or address bit to be selected and a logic zero value causes the corresponding data bit or address bit to be masked, it will be appreciated that this requirement can be met by setting to a logic zero value all of the mask row bits that are associated with the address bits. This ensures that, irrespective of the address bit values, those address bits are not selected for any of the mask rows determined at step 55, and hence those address bits will not influence the value of the associated check bit. This hence prevents the address bit values from potentially interfering with any steps taken to ensure that an all zeros datum will not result in an all zeros check code (and similarly an all ones datum will not result in an all ones check code).

At step 65, for each of the mask rows to be subjected to the row generation rules, the bits of the mask row associated with the datum have their values arranged so that an odd number of data bits will be selected when that mask row is used. As will be discussed in more detail later with reference to the ECC computation algorithm used, this requirement can be used in combination with the ECC computation algorithm to ensure that when the datum bits are all zero, a check bit of one is produced, or when the datum bits are all one a check bit of zero is produced.

In situations where the error code scheme allows correction of at least one bit when an error is detected, then as mentioned earlier there will be multiple mask rows that are subjected to the special row generation rules. In such situations, additional steps need to be taken to ensure that the error correction scheme will not accidentally try to correct a stuck at zero or stuck at one fault. Considering the stuck at zero fault issue, if the datum had a single bit at a logic one value and all of the other bits at a logic zero value, it needs to be ensured that an all zeros error code cannot be generated, since in that instance if the datum and ECC code as subsequently read back from memory was all zeros, this could be detected as a single bit correctable error rather than a stuck at zero fault. To ensure that this does not occur, in one embodiment additional constraints are placed on the multiple mask rows that are subjected to the special row generation rules to ensure that an all zeros check code cannot be generated in situations where a single bit of the datum is non-zero. Similarly, the same constraints will ensure that an all ones check code cannot be produced when only a single bit of the datum is zero.

In particular, as identified in step 65, if multiple mask rows are subjected to the row generation rules, then it is ensured that the mask bits that cause the datum bits to be selected are complementary for the multiple mask rows. This hence ensures that different data bits within the block are selected by each of those multiple mask rows for use in generating the corresponding check bit. Considering by way of example the earlier case where the datum had a single bit set to one and all of the other bits were zero, the single bit set to one will only be selected by one of the multiple mask rows and not by the others. This will ensure that those multiple mask rows do not produce the same check bit, and hence will ensure that the error code has at least one bit set to one. As a result, this will cause the combination of the datum and error code that is then written to memory to have at least two logic one values in it. Accordingly, if when that datum and error code is read back from memory, it is all zeros, this can be reliably interpreted as a stuck at zeros fault.

Furthermore, when multiple of the mask rows are subjected to the row generation rules discussed above, it is also ensured that all of the data bits of the datum are covered by the selecting mask bits specified by the multiple mask rows. Hence, each data bit within the block is selected by one of the multiple mask rows for use in generating the corresponding check bit, thus ensuring that all of the data bits are taken into account by the combination of the multiple mask rows that have their mask bit values constrained using the above identified rules.

Following step 65, at step 70 the remaining mask bits of the mask array are computed. These remaining mask bits are not constrained using the above described techniques, and accordingly can be set using any pre-existing mask generation rules. Hence, for example, column-based Hamming rules may be used to complete these remaining bits of the mask array.

FIG. 3 shows an ECC mask array 100 that may be generated using the technique of FIG. 2 for a chunk identical to the chunk discussed earlier with reference to FIG. 1. Hence, again, the chunk has eight data bits and four address bits, and it is assumed that the DED error code scheme is used, hence resulting in the requirement for five check bits in the check code. In this example, the first mask row 105 of the mask array 100 is subjected to the special row generation rules discussed with reference to FIG. 2. In particular, since the error code scheme only supports error detection, and no error correction, only a single mask row needs to be subjected to those rules. As can be seen, for the mask row 105, all of the mask bits associated with the address bits have their values set to zero, so that the address bits have no influence on the generation of the check bit C0. As also shown, the mask row 105 has its mask bits set so as to select an odd number of bits from the datum, hence meeting the requirement of step 65. As will be discussed in more detail with reference to FIG. 4 when describing the ECC computation algorithm, a computation selectively performed by the ECC computation algorithm effectively adds an extra column 110 to the ECC mask, where that column has a logic one value for each mask row that is subjected to the special row generation rules, and a logic zero value for all of the other mask rows.

Figure 4:
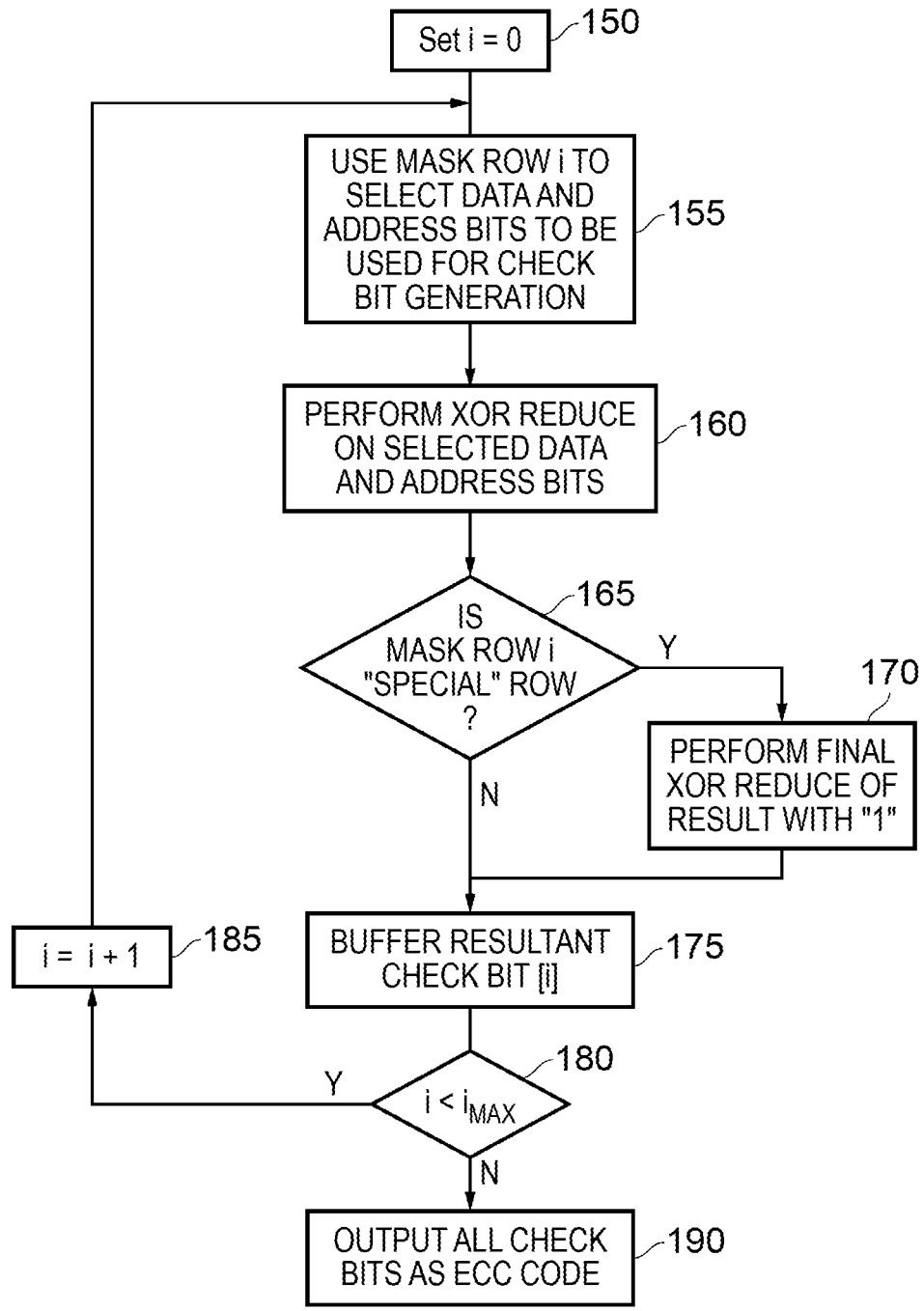
FIG. 4 is a flow diagram illustrating an ECC computation algorithm performed by ECC generation circuitry in accordance with one embodiment in order to generate an error code.

FIG. 4 is a flow diagram illustrating an ECC computation algorithm that may be performed within ECC computation circuitry of an ECC generator in accordance with one embodiment. The equation of the ECC computation algorithm is shown at the top of FIG. 4. As will be apparent from that equation, for each check bit, the corresponding mask row is used to select a subset of the data and address bits, which are then subjected to an XOR reduce operation. The resultant value is then selectively subjected to a further XOR reduce operation with a logic one value dependent on the check bit (and hence mask row) being processed. This is discussed further with reference to the flow diagram of FIG. 4.

At step 150, a parameter i is set equal to zero, whereafter at step 155 the mask row i is used to select the data and address bits that are then to be used for the check bit generation. Hence, using the earlier example, for every mask row bit that is set to a logic one value, the corresponding data or address bit is selected for use in the check bit generation process.

At step 160, an XOR reduce operation is then performed on the selected data and address bits in order to produce a check bit value. However, another check is performed before deciding whether to use that check bit directly within the check code, or whether to subject that check bit to a further manipulation before producing the final check bit. In particular, at step 165 it is determined whether the mask row i is one of the special rows, i.e. one of the rows that has been subjected to the row generation rules discussed with reference to steps 60 and 65 of FIG. 2. If so, then the process proceeds to step 170, where a final XOR reduce operation is performed using the check bit output at step 160, and a logic one value. It will be appreciated that this hence causes the value of the check bit output from step 160 to be flipped. The resultant check bit is then buffered at step 175, or the check bit output from step 160 is directly buffered at step 175 if the mask row under consideration is not one of the special rows.

Thereafter, at step 180, it is determined whether the parameter i is less than a maximum value, and if so the parameter i is incremented, and the process returns to step 155. However, once at step 180 it is determined that all of the mask rows have been processed, and hence the parameter i is equal to i_max, then the process proceeds to step 190 where all of the check bits are output as the ECC code. It will be appreciated that whilst the process of FIG. 4 has been shown as an iterative process, in an alternative embodiment each of the check bits could be generated in parallel.

Returning to FIG. 3, it will hence be seen that the performance of steps 165, 170 in FIG. 4 effectively adds the extra column 110 to the mask array of FIG. 3 by causing a further XOR operation with a logic one value to be performed for the mask row 105 in order to flip the check bit produced at step 160 that mask row, but causing no such flipping to be performed for the check bits produced using all of the other mask rows. In one embodiment, the prevention of a flip for the check bits produced by the other mask rows can be achieved by implementing an XOR operation with a logic zero value, hence causing no change in the state, or alternatively the final XOR operation can be bypassed altogether as per the flow shown in FIG. 4.

Considering the application of the ECC computation algorithm of FIG. 4 when using the mask array of FIG. 3, the following properties are observed. Firstly, consider the case when all of the data bits of the datum are zero. When considering the first row 105 of the mask array, this will result in a logic zero value being output as a result of the XOR reduction operation of the address (as the mask for the address is zero, so regardless of the address input, the output is zero). The first mask row 105 will also cause a logic zero to be output on the XOR reduce of the data (as the data inputs are all zeros, so regardless of the mask, the XOR reduce will output zero).

The final XOR with a logic one value resulting from performance of the step 170 will then provide a check bit that is one, so that at least one of the check bits is non-zero. This hence enables reliable detection of a stuck at zeros fault, since when the datum is all zeros a check code of all zeros is not a valid check code. Hence, if the datum and check code read back from memory are all zeros, this indicates a stuck at zeros fault.

As a second scenario, consider a situation where all of the data inputs are at a logic one value. Again, due to the logic zero values within the mask row 105 corresponding to all of the address bits, the XOR reduce of the address will result in a logic zero value. The first row 105 will output a logic one value on the XOR reduce of the data (due to the fact that the odd number of ones will result in a final reduction of one). As a result, the final XOR operation performed at step 170 will flip the logic one value in order to produce a check bit of zero, so that at least one of the check bits in the resultant check code is zero. This will hence enable a reliable detection of a stuck at one fault, since if the datum and associated error code read back from memory are all ones, this indicates a stuck at one fault (an error code of all ones not being a valid error code for a datum of all ones).

FIG. 5A illustrates an ECC mask that may be generated using the mask generation method of FIG. 2 for a single error correction double error detection (SECDED) scheme, for which the Hamming distance is four. Again it is assumed that the chunk is the same as before, and hence consists of eight data bits and four address bits. Based on that chunk size and the Hamming distance of four, the error code requires six check bits, and hence the mask array has six rows as shown in FIG. 5A. Using the process discussed earlier with reference to FIG. 2, it will be determined that two of the mask rows 205, 210 need to be subjected to the special row generation rules. Whilst these are shown as being the first two mask rows within the array, it will be appreciated that it does not matter which two mask rows are chosen. As shown in FIG. 5A, each of the mask rows 205, 210 has its mask bits associated with the address bits set equal to zero, so that the address bits cannot influence the value of the check bits C0 and C1. Further, each of the mask rows 205, 210 has an odd number of mask row bits set to one in the locations corresponding to the datum bits, so as to cause an odd number of datum bits to be selected. Further, the mask bits that are set to one are complementary between the two mask rows 205, 210, hence ensuring that any particular datum bit is only used in the calculation of either check bit C0 or check bit C1. Further, it will be seen that the combination of the two mask rows 205, 210 ensures that all of the datum bits are selected for use in generating either the check bit C0 or the check bit C1. These two mask rows 205, 210 hence conform to the rules set out in steps 60 and 65 of FIG. 2.

When performing the process of FIG. 4, steps 165, 170 provide an effective extra column of the form shown by the reference numeral 215 in FIG. 5A, containing logic one values associated with the mask rows 205, 210 and logic zero values for the remaining mask rows.

Due to the fact that the number of datum bits is even, the earlier discussed equation used at step 55 of FIG. 2 to determine the number of mask rows required to be subjected to the special row generation rules will identify that only two mask rows need to be subjected to those rules. However, if the number of datum bits were odd, then a third mask row would need to be subjected to the special row generation rules.

FIG. 5B illustrates another example of an ECC mask array that may be produced using the earlier described technique of FIG. 2, assuming the error code scheme is a double error correction triple error detection (DECTED) scheme, hence having a Hamming distance of six. In this example, it is assumed that the chunk is comprised of four address bits and nine data bits. Taking into account the chunk size, and the Hamming distance of six, this requires nine check bits within the check code, as illustrated in FIG. 5B. In accordance with the equation discussed earlier with reference to step 55 of FIG. 2, it will be determined that three mask rows need to be subjected to the row generation rules of steps 60 and 65 of FIG. 2. If the number of datum bits had been even, a fourth mask row would also need to be subjected to those rules.

As shown in FIG. 5B, for the mask array 250, the three mask rows subjected to the special row generation rules are the mask rows 255, 260, 265. As clearly shown, each of those mask rows has its mask bits set to zero in the bit positions corresponding to the address bits. Further, each of those mask rows causes an odd number of the data bits to be selected, and each mask row selects different data bits to each of the other of those three mask rows. Further, across the three mask rows 255, 260, 265, each data bit is selected once. Hence it can be seen that the rules of steps 60 and 65 of FIG. 2 are met. The column 270 shows the effective extra column resulting from performance of steps 165, 170 of FIG. 4, with logic one values in each of the row positions associated with the special mask rows 255, 260, 265 and logic zero values associated with all of the other mask rows.

FIG. 6 is a table shown the Hamming distances and the minimum number of rows that are needed with zeros in the address position, for a variety of different error code schemes, when adopting the mask generation scheme of FIG. 2. As will be apparent from the equation discussed earlier with reference to step 55 of FIG. 2, for any of the schemes that support one or more bits being corrected, the actual number of rows may need to be increased by one, dependent on whether the datum has an even number of bits or an odd number of bits. Further, it will be appreciated that FIG. 6 merely illustrates four example error code schemes, but the above described techniques are applicable to other error code schemes as well, with the number of rows required in each case being determined by the equation discussed earlier with reference to step 55 of FIG. 2.

Figure 7:
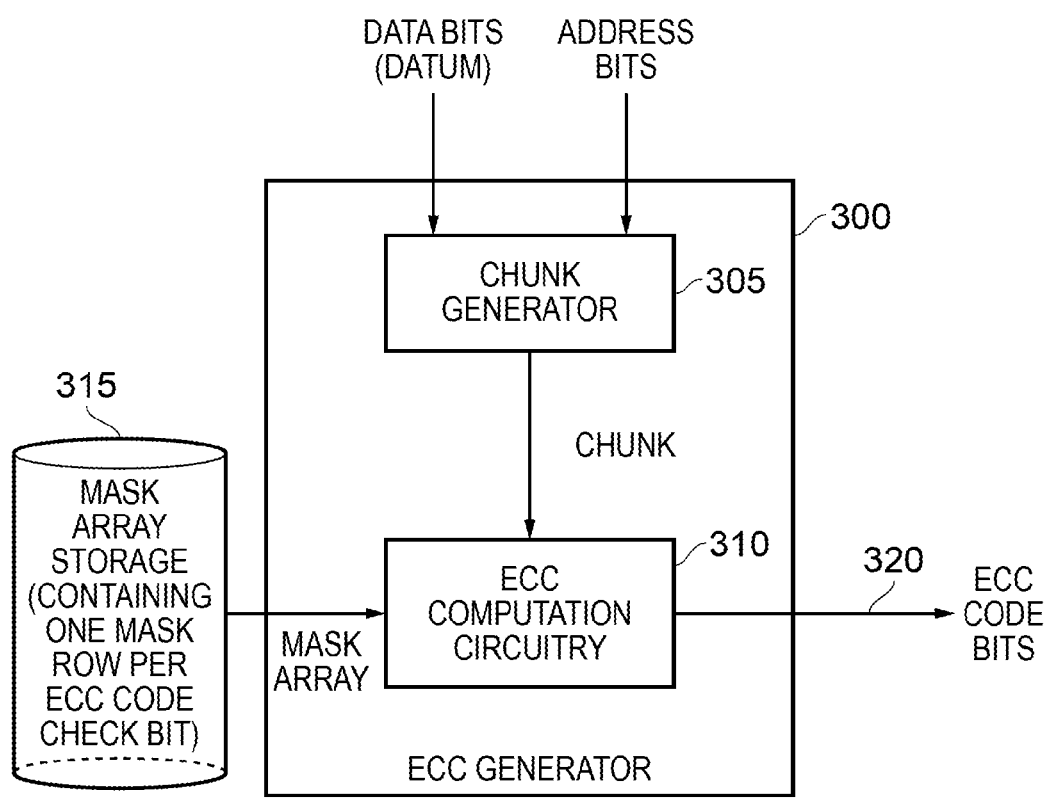
FIG. 7 is a block diagram of an ECC generator circuitry in accordance with one embodiment.

FIG. 7 is a block diagram of an ECC generator circuit that may be used in accordance with one embodiment to generate an ECC code using the earlier discussed mask array. In particular, the datum and the address bits are input to a chunk generator 305 which generates a chunk by appending the address bits to the data bits. The ECC computation circuitry 310 then receives the chunk, and also has access to the mask array stored within the storage 315. The ECC computation circuitry 310 then performs the process discussed earlier with reference to FIG. 4 in order to generate the ECC code bits which are output over path 320. From the earlier discussions, it will be appreciated that the ECC computation circuitry will generate an ECC code which will have at least one check bit set to a logic one value when the datum is all zeros, or will have at least one check bit set to a logic zero value when the datum bits are all ones. Further, by use of the multiple mask rows that are subjected to the special row generation scheme for situations where the error code scheme allows correction of a certain number of bits of error, the ECC computation circuitry will ensure that the error code generated for storing with the datum will be sufficient to reliably detect stuck at zero or stuck at one faults (rather than incorrectly interpreting them as correctable errors).

Figure 8:
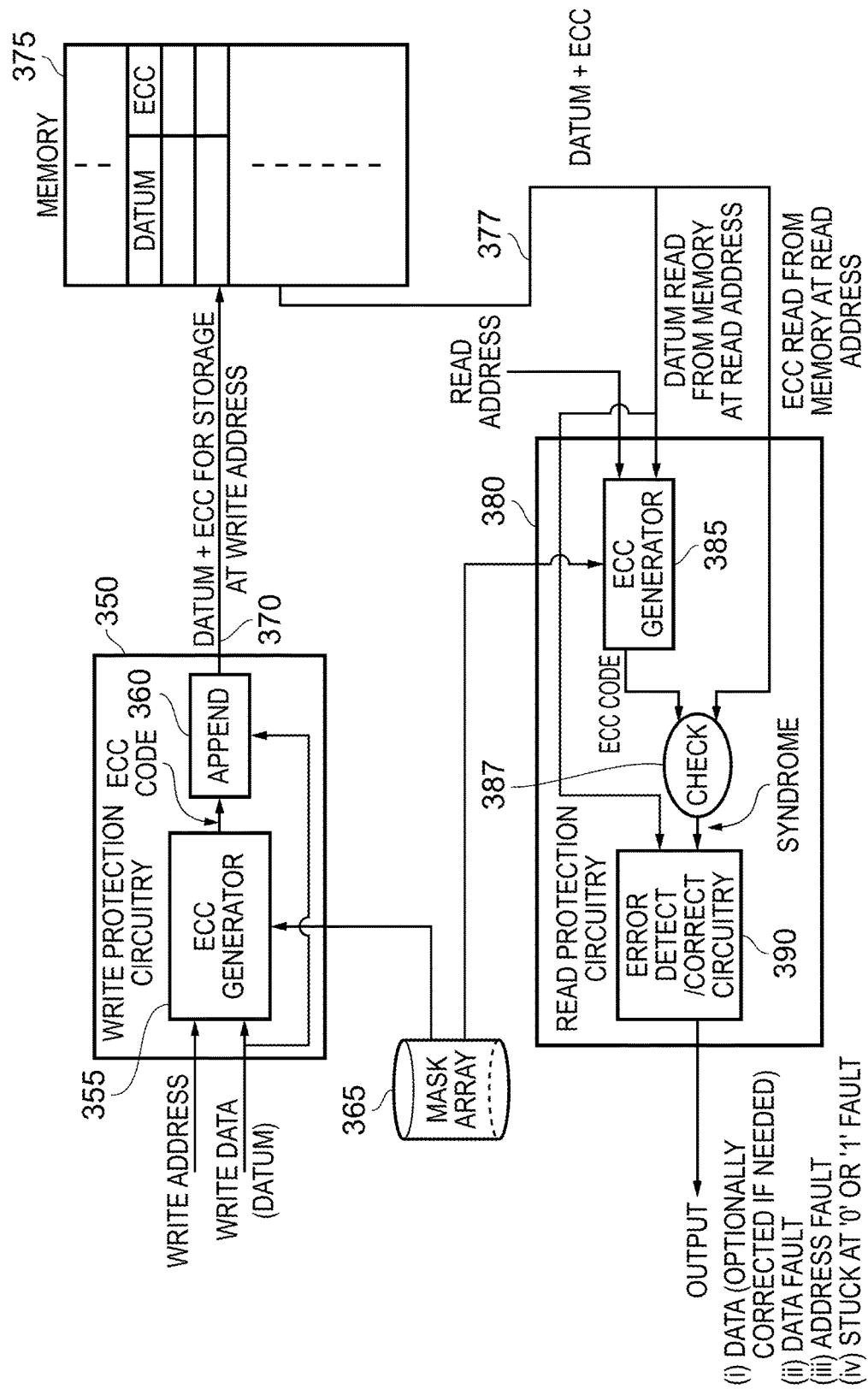
FIG. 8 is a block diagram schematically illustrating both write protection circuitry and read protection circuitry in accordance with one embodiment.

FIG. 8 is a diagram illustrating both write protection circuitry 350 and read protection circuitry 380 that may be used in association with a memory 375. When write data is to be written into the memory 375, the write address and the write data are provided to the ECC generator 355 within the write protection circuitry 350. The ECC generator 355 may take the form of the ECC generator 300 discussed earlier with reference to FIG. 7. Hence, the ECC generator will have access to the mask array within the storage 365, that mask array having been generated using the above described techniques. The ECC generator 355 will generate an ECC code that is forwarded to the appending circuitry 360, which then appends the ECC code to the write data, with both that write data and ECC code then being output over path 370 for storage within the memory 375 at the write address specified in association with the write data.

When that datum and associated ECC code is subsequently read from memory over path 377 as a result of a specified read address, the datum read from the memory at the read address is forwarded to the ECC generator 385 along with the specified read address. The ECC generator 385 also takes the form of the ECC generator 300 shown in FIG. 7, and has access to the mask array within the storage 365. Accordingly, it will generate an ECC code using the mask array, the read address and the read datum, and that will be forwarded to the checking circuitry 387 which can determine whether the calculated ECC code matches the ECC code that was read from the memory address. The check circuitry 387 produces syndrome information as a result of the check which is passed to the error detect/correct circuitry 390 along with the datum read from memory. The syndrome information will identify whether the ECC code generated by the ECC generator 385 matches the ECC code read from memory, and in the event that it does not, can also provide additional information about the type of error. This information can then be used by the circuitry 390 to determine the appropriate output from the read protection circuitry 380.

For example, if it is determined that the two ECC codes match and hence there are no errors, then the read data may be output. Similarly, if the syndrome information identifies that there is a correctable data error, then the circuitry 390 may correct that data and output the corrected data. If the syndrome information identifies that there is a data fault that is not correctable, then the circuitry 390 will identify as its output that there is a data fault. Similarly, the syndrome information may identify that there is a fault in the address rather than in the data, and accordingly an address decode fault error can be output from the circuitry 390. Finally, if the datum as read from memory is all zeros (or all ones), and the ECC read from memory is all zeros (or all ones), then this will indicate the presence of a stuck at zero or stuck at one fault, and accordingly that can also be output from the circuitry 390. Alternatively, address decode errors and stuck at zero/one errors may not be explicitly identified separately to any other type of uncorrectable error, and instead may just cause an indication of an uncorrectable error to be output from the circuitry 390.

Figure 9:
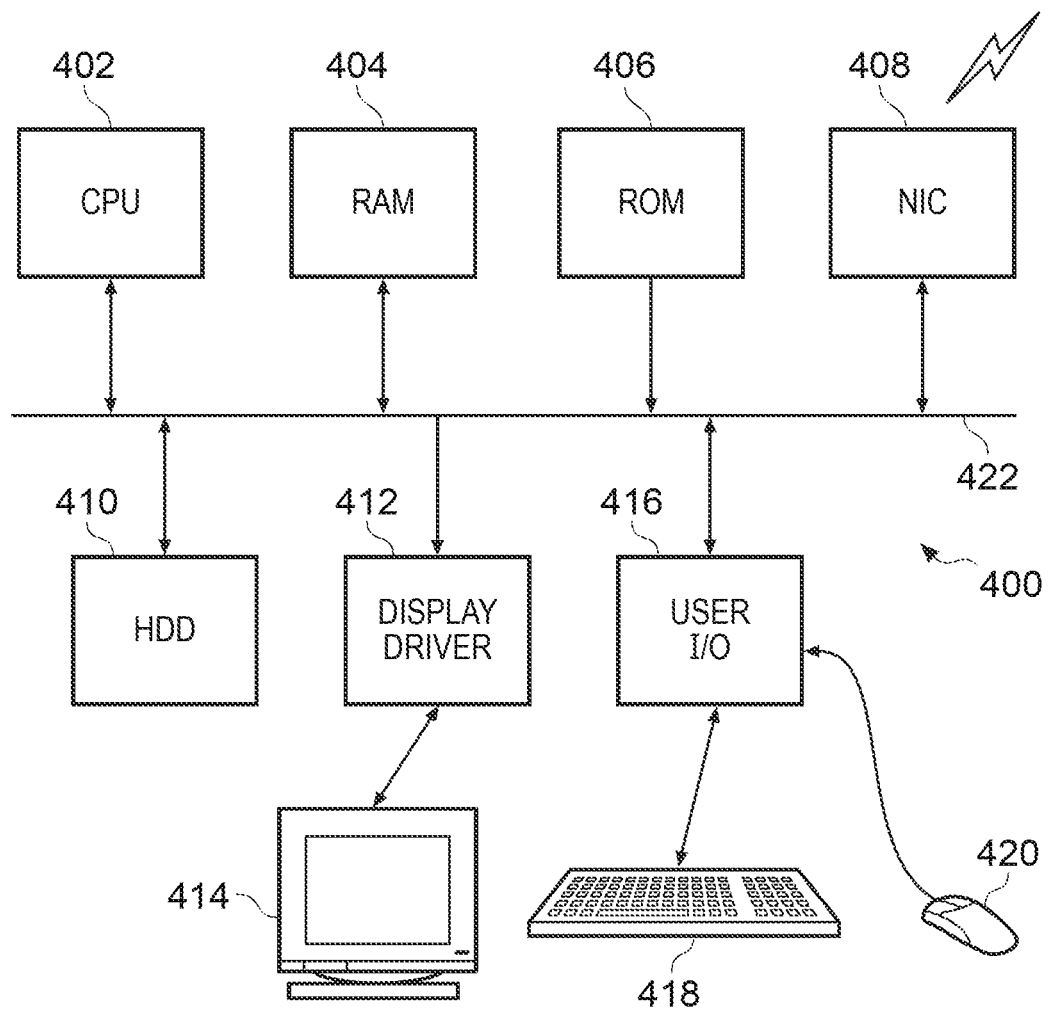
FIG. 9 schematically illustrates a general purpose computer of the type that can be used to implement the mask generation technique of the described embodiments.

FIG. 9 schematically illustrates a general purpose computer 400 of the type that may be used to implement the above described techniques, and in particular the generation of a mask array for use in generating an error code for a block comprising a plurality of data bits and a plurality of address bits. The general purpose computer 400 includes a central processing unit 402, a random access memory 404, a read-only memory 406, a network interface card 408, a hard disk drive 410, a display driver 412 and monitor 414, and a user input/output circuit 416 with a keyboard 418 and mouse 420 all connected via a common bus 422. In operation the central processing unit 402 will execute computer program instructions that may be stored in one or more of the random access memory 404, the read-only memory 406 and the hard disk drive 410, or dynamically downloaded via the network interface card 408. The results of the processing performed may be displayed to a user via the display driver 412 and the monitor 414. User inputs for controlling the operation of the general purpose computer 400 may be received via the user input/output circuit 416 from the keyboard 418 or the mouse 420. It will be appreciated that the computer program could be written in a variety of different computer languages. The computer program may be stored and distributed on a recording medium or dynamically downloaded to the general purpose computer 400. When operating under control of an appropriate computer program, the general purpose computer 400 can perform the above described mask array generation techniques and can be considered to form an apparatus for performing the above described techniques. The architecture of the general purpose computer could vary considerably, and FIG. 9 is only one example.

From the above described embodiments, it will be appreciated that the described techniques enable a mask array to be generated that can not only enable detection and/or correction of data bit errors in a datum stored in memory, but can also allow for address decoding errors to be identified whilst additionally providing support for detection of stuck at zero or stuck at one faults in the memory output. This is achieved whilst still providing an error code whose number of check bits is dictated by the size of the chunk being protected, and the type of error code scheme being employed, and hence without needing to add any additional redundant bits that would have area implications on the size of the memory.

In the present application, the words "configured to . . . " are used to mean that an element of an apparatus has a configuration able to carry out the defined operation. In this context, a "configuration" means an arrangement or manner of interconnection of hardware or software. For example, the apparatus may have dedicated hardware which provides the defined operation, or a processor or other processing device may be programmed to perform the function. "Configured to" does not imply that the apparatus element needs to be changed in any way in order to provide the defined operation.

Although illustrative embodiments of the invention have been described in detail herein with reference to the accompanying drawings, it is to be understood that the invention is not limited to those precise embodiments, and that various changes, additions and modifications can be effected therein by one skilled in the art without departing from the scope and spirit of the invention as defined by the appended claims. For example, various combinations of the features of the dependent claims could be made with the features of the independent claims without departing from the scope of the present invention.

The invention claimed is:

1. An apparatus, comprising:
   block generation circuitry to generate a block comprising a plurality of data bits and a plurality of address bits; and
   error code generation circuitry to receive said block and a mask array comprising a plurality of mask rows, and to apply an error code generation algorithm to generate an error code for said block, said error code comprising a plurality of check bits where each check bit is determined using said block and a corresponding mask row of said mask array;
   wherein each mask row comprises a plurality of mask bits, each mask bit being associated with a corresponding bit of said block, and at least one mask row has its mask bit values constrained so as to ensure that when all of the data bits of the block have the same value, the error code generated by the error code generation circuitry has at least one check bit having a different value to the value of the data bits irrespective of the value of the address bits.

2. An apparatus as claimed in claim 1, wherein each mask row in said at least one mask row has its mask bit values arranged so as to cause none of the address bits of the block to be selected for use in generating the corresponding check bit.

3. An apparatus as claimed in claim 1, wherein the number of mask rows forming said at least one mask row is dependent on an error code scheme employed by the apparatus, and whether the plurality of data bits in said block is even or odd.

4. An apparatus as claimed in claim 3, wherein the number of mask rows NO forming said at least one mask row is given by the equation:

$$NO=1+C+[[((1+C)\%2)!=(Dt\ \%2)]\&(C!=0)]$$

where C is the number of bits correctable by the error code scheme, Dt is the number of data bits in said plurality of data bits, and % denotes a modulo operator.

5. An apparatus as claimed in claim 1, wherein each mask row in said at least one mask row has its mask bit values arranged so as to cause an odd number of data bits within the block to be selected for use in generating the corresponding check bit.

6. An apparatus as claimed in claim 5, wherein when said at least one mask row comprises multiple mask rows, the mask bit values in said multiple mask rows are arranged to ensure that different data bits within the block are selected by each of those multiple mask rows for use in generating the corresponding check bit.

7. An apparatus as claimed in claim 6, wherein when said at least one mask row comprises multiple mask rows, the mask bit values in said multiple mask rows are arranged to further ensure that each data bit within said block is selected by one of the multiple mask rows for use in generating the corresponding check bit.

8. An apparatus as claimed in claim 1, wherein:
   the error code generation algorithm comprises a main process to generate a first check bit from the block and a corresponding mask row, and an additional process selectively applied to invert the first check bit to produce a second check bit; and
   the error code generated by the error code generation circuitry comprises the second check bit generated using any mask rows forming said at least one mask row and the first check bit generated using each of the remaining mask rows.

9. An apparatus as claimed in claim 8, wherein said main process comprises using a mask row to select a subset of the bits forming said block, and then performing an XOR reduce operation on the selected subset of the bits to produce an associated first check bit.

10. An apparatus as claimed in claim 9, wherein said additional process comprises an XOR operation to invert the value of the first check bit.

11. Write protection circuitry to generate an error code to be stored in association with write data at a specified memory address of a storage device, comprising an apparatus as claimed in claim 1 to generate the error code from the write data and the specified memory address, wherein the plurality of data bits of the block are formed from the write data and the plurality of address bits of the block are formed from the specified memory address.

12. Read protection circuitry to perform an error check process on read data obtained from a specified memory address in a storage device, comprising:
   an apparatus as claimed in claim 1, to generate an error code from the read data and the specified memory address, wherein the plurality of data bits of the block are formed from the read data and the plurality of address bits of the block are formed from the specified memory address; and
   check circuitry to compare the generated error code with an error code stored in the storage device in association with the read data in order to detect an error condition when the generated error code differs from the stored error code.

13. A computer-implemented method of generating a mask array comprising:
   determining a number of mask rows of the mask array so that one mask row is provided for each check bit of an error code to be generated using said mask array;
   determining a number of mask bits in each mask row dependent on a number of bits in a block for which the error code is to be generated, the block comprising a plurality of data bits and a plurality of address bits; and
   for at least one of the mask rows, executing on processing circuitry a mask bit generating process to constrain the mask bit values of that mask row so as to ensure that when all of the data bits of the block have the same value, the error code generated for that block using the mask array has at least one check bit having a different value to the value of the data bits irrespective of the value of the address bits.

14. A computer-implemented method as claimed in claim 13, wherein for all remaining mask rows other than said at least one mask row, the mask bit generating process employs default mask generation rules to determine the mask bits values.

15. A computer-implemented method as claimed in claim 14, wherein said default mask generation rules comprise column-based Hamming rules.

16. A computer-implemented method as claimed in claim 13, wherein, for each mask row in said at least one mask row, the mask bit generating process determines the mask bit values so as to cause none of the address bits of the block to be selected for use when generating the corresponding check bit.

17. A computer-implemented method as claimed in claim 13, further comprising determining the number of mask rows to form said at least one mask row dependent on an error code scheme to be employed, and dependent on whether the plurality of data bits in said block is even or odd.

18. A computer-implemented method as claimed in claim 17, wherein the number of mask rows NO forming said at least one mask row is given by the equation:

$$N0=1+C+[[((1+C)\%2)!=(Dt\ \%2)]\&(C!=0)]$$

where C is the number of bits correctable by the error code scheme, Dt is the number of data bits in said plurality of data bits, and % denotes a modulo operator.

19. A computer-implemented method as claimed in claim 13, wherein for each mask row in said at least one mask row, the mask bit generating process determines the mask bit values so as to cause an odd number of data bits within the block to be selected for use when generating the corresponding check bit.

20. A computer-implemented method as claimed in claim 19, wherein when said at least one mask row comprises multiple mask rows, the mask bit generating process determines the mask bit values in said multiple mask rows to ensure that different data bits within the block are selected by each of those multiple mask rows for use when generating the corresponding check bit.

21. A computer-implemented method as claimed in claim 20, wherein when said at least one mask row comprises multiple mask rows, the mask bit generating process determines the mask bit values in said multiple mask rows to further ensure that each data bit within said block is selected by one of the multiple mask rows for use when generating the corresponding check bit.

22. A storage medium containing a mask array generated in accordance with the computer-implemented method of claim 13.

* * * * *